(12) United States Patent
Venkata

(10) Patent No.: US 9,390,770 B2
(45) Date of Patent: Jul. 12, 2016

(54) APPARATUSES AND METHODS FOR ACCESSING MEMORY INCLUDING SENSE AMPLIFIER SECTIONS AND COUPLED SOURCES

(71) Applicant: MICRON TECHNOLOGY, INC., Boise, ID (US)

(72) Inventor: Harish Venkata, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 73 days.

(21) Appl. No.: 14/280,206

(22) Filed: May 16, 2014

(65) Prior Publication Data

US 2015/0332740 A1    Nov. 19, 2015

(51) Int. Cl.
  *G11C 5/06*    (2006.01)
  *G11C 7/08*    (2006.01)
  *G11C 7/12*    (2006.01)

(52) U.S. Cl.
  CPC .. *G11C 7/08* (2013.01); *G11C 5/06* (2013.01); *G11C 7/12* (2013.01)

(58) Field of Classification Search
  CPC .............................. G11C 7/051; G11C 7/1006
  USPC ...................... 365/63, 189.14, 189.15, 189.16
  See application file for complete search history.

(56) References Cited

U.S. PATENT DOCUMENTS

| | | | |
|---|---|---|---|
| 6,310,815 B1 | 10/2001 | Yamagata et al. | |
| 6,400,597 B1 * | 6/2002 | Nagaoka | G11C 8/12 365/189.08 |
| 6,480,407 B1 | 11/2002 | Keeth | |
| 7,616,512 B2 | 11/2009 | Kim et al. | |
| 7,983,109 B2 * | 7/2011 | Hanzawa | G11C 13/0004 365/195 |
| 2005/0146957 A1 | 7/2005 | Lee et al. | |
| 2011/0044120 A1 | 2/2011 | Nakagawa et al. | |
| 2014/0347945 A1 | 11/2014 | Venkata et al. | |

OTHER PUBLICATIONS

Kalter, et al., "A 50-ns 16-Mb DRAM with a 10-ns Data Rate and On-Chip ECC", IEEE Journal of Solid-State Circuits vol. 25, No. 5, Oct. 1990, 1118-1128.

* cited by examiner

*Primary Examiner* — Son Dinh
(74) *Attorney, Agent, or Firm* — Dorsey & Whitney LLP

(57) ABSTRACT

Apparatuses and methods for accessing memory are described. An example method includes accessing memory cells of a memory section, and sharing a source of an inactive sense amplifier section with an active sense amplifier section coupled to the memory cells of the memory section during a memory access operation to the memory section coupled to the active sense amplifier section. An example apparatus includes a memory section and a first sense amplifier section associated with the memory section. The first sense amplifier section includes a sense amplifier and includes a read/write circuit coupled to a first source associated with the first sense amplifier section. The source associated with the first sense amplifier section is coupled to a source associated with a second sense amplifier section. The second sense amplifier section is configured to be inactive during a memory access operation to the memory section.

20 Claims, 4 Drawing Sheets

FIG. 1

APPARATUSES AND METHODS FOR ACCESSING MEMORY INCLUDING SENSE AMPLIFIER SECTIONS AND COUPLED SOURCES

BACKGROUND

Semiconductor memory is used to store information. The information may be written to the memory and then read at a later time. During a memory access operation to the memory, for example, a write operation to write information to the memory or a read operation to read information from the memory, signals internal to the memory are generated and provided on signal lines. The internal signals are typically represented by voltages, and the voltages on the signal lines may change as the information being read or written changes. A relatively low voltage on a signal line may be changed to a relatively high voltage by driving a voltage onto the signal line. A relatively high voltage on a signal line may be changed to a relatively low voltage by discharging the voltage, for example, to a reference voltage such as ground. The process of changing the voltage of a signal line from one voltage to another requires a finite amount of time, which is a contributing factor to the time for completing a memory operation. Generally, completing memory operations more quickly is desirable. As a result, reducing the time needed to change the voltage of a signal line from one voltage to another may be desirable to improve, that is, decrease, the time for completing a memory operation.

BRIEF DESCRIPTION OF THE DRAWINGS

FIG. 1 is a block diagram of an apparatus including a memory block according to an embodiment of the invention.

DETAILED DESCRIPTION

Figure 2:
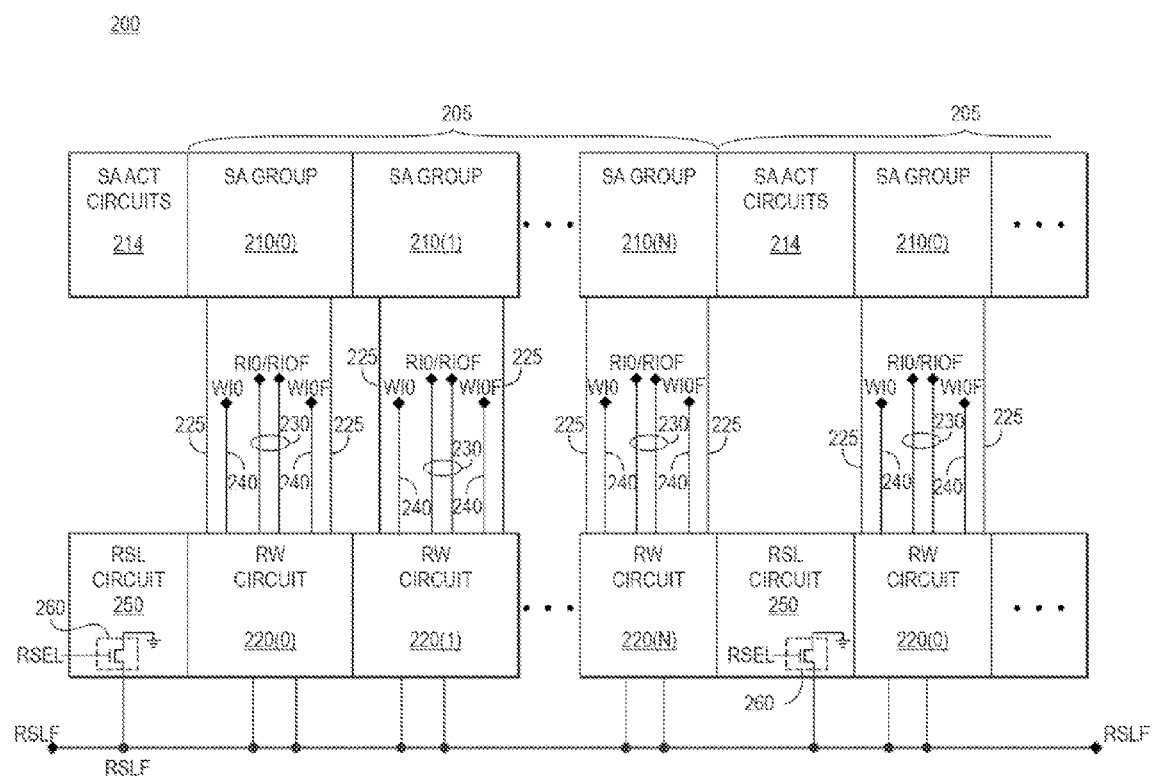
FIG. 2 is a block diagram of a sense amplifier section according to an embodiment of the invention.

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
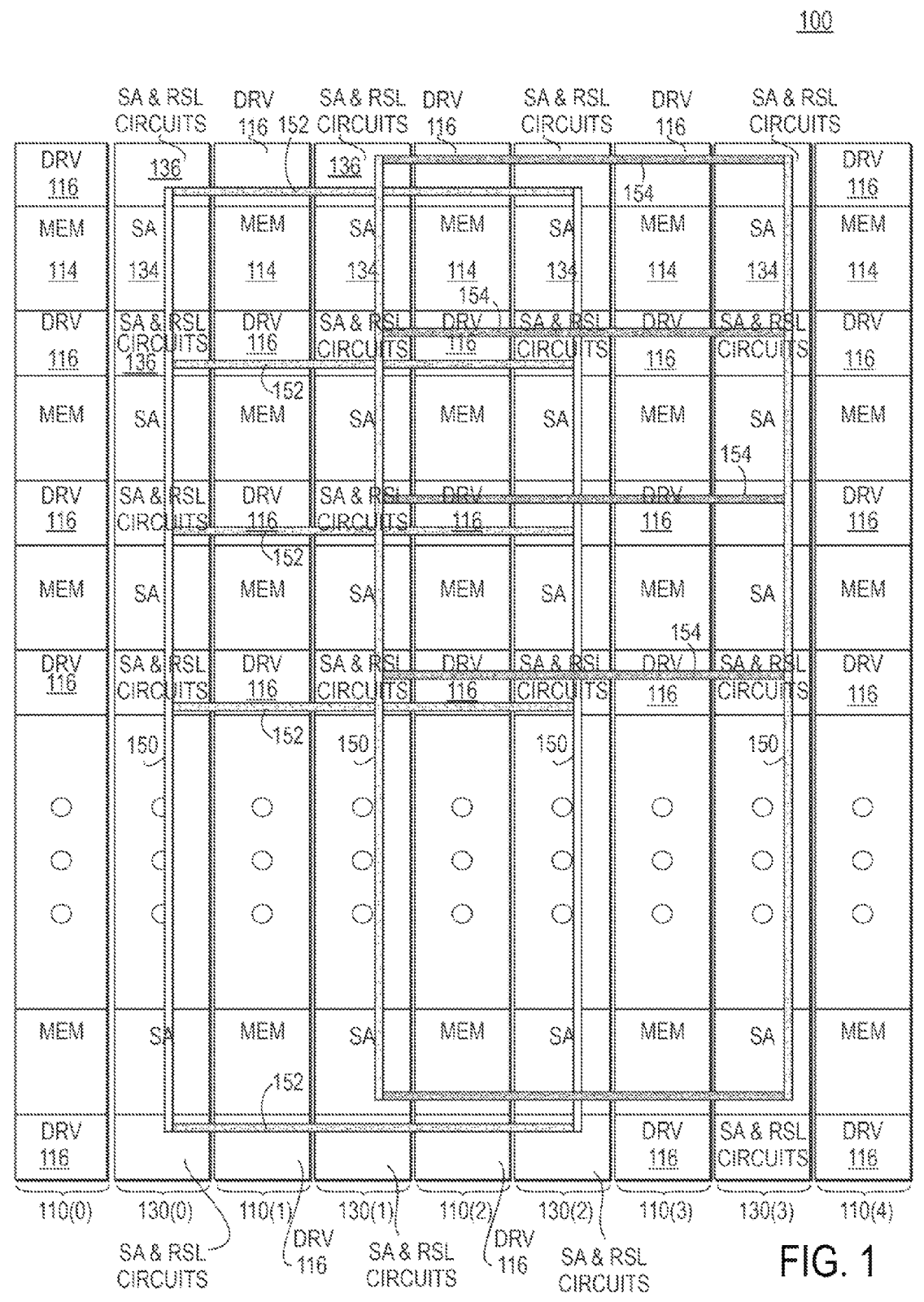

FIG. 1 illustrates an apparatus including a memory block 100 according to an embodiment of the invention. The memory block 100 includes memory sections 110(0)-110(4). A memory section 110 includes memory sub-sections 114 having memory cells (not shown in FIG. 1) that may be used to store data states. The memory sub-sections 114 of a memory section 110 may include access lines that are coupled to access line drivers 116 that are configured to drive the access lines to activate memory cells for a memory access operation, for example, a read, write/program, erase, and/or refresh operation. The memory block 100 further includes sense amplifier sections 130(0)-(3). A sense amplifier section 130 includes sense amplifier sub-sections 134, which may be coupled to sense amplifier activation and source circuits 136.

A sense amplifier sub-section 134 may include a plurality of sense amplifiers (not shown in FIG. 1) that are configured to sense and amplify data states stored by memory cells of a memory sub-section or memory sub-sections 114 associated with the respective sense amplifier sub-section. The sense amplifiers of a sense amplifier sub-section 134 may be grouped into sense amplifier groups. The sense amplifier sub-section 134 further includes read/write (RW) circuits (not shown in FIG. 1). In some embodiments, each RW circuit is associated with a respective sense amplifier group, for example, a RW circuit may be configured to amplify a sensed data state of a selected sense amplifier of a respective sense amplifier group during a memory access operation. The sense amplifier activation and source circuits 136 may include circuits used during operation of the sense amplifiers and RW circuits of sense amplifier sub-sections 134.

A source RSLF 150 may be associated with a respective sense amplifier section, and may be coupled to the RW circuits of the respective sense amplifier section 130. Examples of a source may include, a source line, a source slot, a source region, as well as other sources. The RSLF source 150 may also be coupled to circuits included in the sense amplifier activation and source circuits 136. In some embodiments, the sense amplifier activation and source circuits 136 include a source circuit configured to couple the RSLF source 150 to a reference voltage (e.g., ground) during a memory access operation, for example, a read operation. The RSLF source 150 may provide a conductive path to the reference voltage on which a voltage may be discharged, such as by the RW circuits to create a voltage differential on signal lines to represent data, as will be described in more detail below. The RW circuits of the same sense amplifier section 130 may be coupled to a common RSLF source 150 associated with that sense amplifier section. For example, the RW circuits included in a sense amplifier section 130 may each be provided the same RSLF voltage on the common RSLF source. Different sense amplifier sections 130 may be provided with different RSLF voltages on the respective RSLF sources. For example, the RW circuits in a sense amplifier section 130 may be provided with a high voltage level RSLF voltage, whereas the RW circuits in another sense amplifier section 130 may be provided with a RSLF voltage that may change voltage levels during a memory access operation involving that sense amplifier section 130.

The RSLF sources 150 of two or more sense amplifier sections 130 may be coupled together so that the RSLF sources 150 of multiple sense amplifier sections 130 may be used by active RW circuits of an active sense amplifier section during a memory access operation. The RSLF sources coupled together may provide greater capacity to discharge voltage during the memory access operation to memory sub-sections 114 associated with the sense amplifier sub-sections of an active sense amplifier section. The sense amplifier sections 130 having RSLF sources 150 coupled together may have one of the sense amplifier sections 130 active during the memory access operation, while the other sense amplifier section or sections 130 are inactive. The RSLF source 150 of the inactive sense amplifier section is not used during the memory access operation and may provide added discharge capacity for the memory access operation of the active sense amplifier section. For example, voltage may be discharged to a reference voltage through the source circuits coupled to the multiple RSLF lines 150. That is, the multiple source circuits and RSLF sources provide greater current capacity to discharge voltage to the reference voltage in comparison to discharging voltage through one source circuit and one RSLF source.

In the embodiment of FIG. 1, the RSLF sources 150 of sense amplifier sections 130(0) and 130(2) are coupled together, and the RW circuits of the sense amplifier sections 130(0) and 130(2) may use the coupled RSLF sources 150 during a memory access operation. During a memory access operation to memory sub-sections 114 associated with the sense amplifier section 130(0) or sense amplifier section 130 (2), the sense amplifier section 130(0) or sense amplifier section 130(2) may be active, while the other sense amplifier section is inactive to allow its RSLF source to provide additional discharge capacity during the memory access operation. Similarly, the RSLF sources 150 of sense amplifier sections 130(1) and 130(3) are coupled together, and the RW circuits of the sense amplifier sections 130(1) and 130(3) may use the coupled RSLF sources during a memory access operation. During a memory access operation to memory sub-sections 114 associated with the sense amplifier section 130 (1) or sense amplifier section 130(3), the sense amplifier section 130(1) or sense amplifier section 130(3) may be active, while the other sense amplifier section is inactive to allow its RSLF source to provide additional discharge capacity during the memory access operation.

The RSLF sources 150 may be coupled at multiple locations along the RSLF sources, for example, as shown in FIG. 1. The RSLF sources 150 of sense amplifier sections 130(0) and 130(2) are coupled together at connections 152 along the lengths of the associated RSLF sources, and the RSLF sources 150 of sense amplifier sections 130(1) and 130(3) are coupled together at connections 154 along the lengths of the associated RSLF sources. The RSLF sources of the sense amplifier sections 130 may be coupled together at greater or fewer connections in other embodiments. In some embodiments, the sources associated with multiple sense amplifier sections may be directly coupled together by physical connection, for example, through a conductive material (e.g., conductive and/or semi-conductive structures) coupled between the RSLF sources. In some embodiments, the sources associated with multiple sense amplifier sections may be coupled together through a switch or switches that may selectively couple the sources together. Other configurations of coupling the sources together may be used as well.

As previously described, sense amplifiers of a sense amplifier sub-section 134 may be associated with a memory sub-section or memory sub-sections 114. For example, a sense amplifier sub-section 134 of the sense amplifier section 130 (0) may include groups of sense amplifiers that are coupled to the memory cells of a memory sub-section 114 of memory sections 110(0) or 110(1). In another example, a sense amplifier sub-section 134 of the sense amplifier section 130(0) may include groups of sense amplifiers that are coupled to the memory cells of multiple memory sub-sections 114, for example, a memory sub-section of memory section 110(0) and a memory sub-section 114 of memory section 110(1). As a result, when an access operation is directed to memory cells of the memory sub-sections 114 of memory section 110(1), the sense amplifier groups included in the sense amplifier sub-sections 134 of sense amplifier section 130(0) and sense amplifier section 130(1) may be activated to sense data states of the memory cells.

In operation, memory cells in the memory sub-sections 114 of a memory section 110 may be accessed during a memory access operation. The memory section 110 including the memory cells to be accessed may be referred to as an active memory section. A memory section 110 not including memory cells being accessed during a memory access operation may be referred to an inactive memory section. The memory cells being accessed may be coupled to sense amplifiers in the sense amplifier sub-sections 134 that are associated with the memory sub-sections 114 of the active memory section 110. The sense amplifier sections 130 including the sense amplifiers to which the memory cells being accessed are coupled may be referred to as active sense amplifier sections. A sense amplifier section 130 that does not include sense amplifiers that are coupled to memory cells during the memory access operation may be referred to as an inactive sense amplifier section.

During the memory access operation, RW circuits of an active sense amplifier section 130 may be coupled to the respective RSLF source 150. As previously discussed, the RSLF sources 150 of multiple sense amplifier sections 130 may be coupled together. A sense amplifier section 130 of the multiple sense amplifier sections 130 may be active during the memory access operation, while another sense amplifier section 130 of the multiple sense amplifier sections 130 may be inactive. As a result, the RSLF sources of the multiple sense amplifier sections may provide greater capacity, for example, for discharging voltage through the RW circuits of the active sense amplifier section 130. The RW circuits of the active sense amplifier section 130 are coupled to the RSLF source associated with the active sense amplifier section 130 during the memory access operation, which is coupled to the RSLF source of an inactive sense amplifier section or sense amplifier sections 130. For example, assuming an access operation is directed to memory cells of the memory sub-sections 114 of memory section 110(1), and the sense amplifier groups of sense amplifier section 130(0) and sense amplifier section 130(1) are activated to sense data states, the active sense amplifier section 130(0) may use the RSLF source of inactive sense amplifier section 130(2) because the RSLF source of the sense amplifier sections 130(0) and 130(2) are coupled together. Likewise, the active sense amplifier section 130(1) may use the RSLF source of inactive sense amplifier section 130(3) because the RSLF source of the sense amplifier sections 130(1) and 130(3) are coupled together.

In the embodiment illustrated in FIG. 1, the RSLF sources of two sense amplifier sections 130 are coupled together, however, in other embodiments, the RSLF sources of a greater number of sense amplifier sections 130 may be coupled together. Also in the embodiment illustrated in FIG. 1, the RSLF sources of "even" or "odd" sense amplifier sections are coupled together. For example, the RSLF sources of sense amplifier sections 130(0) and 130(2), which represent two even sense amplifier sections, and the RSLF sources of sense amplifier sections 130(1) and 130(3), which represent two odd sense amplifier sections, are coupled together. However, in other embodiments the RSLF sources of even and odd sense amplifier sections may be coupled together.

FIG. 2 illustrates a sense amplifier section 200 according to an embodiment of the invention. The sense amplifier section 200 may be used for a sense amplifier section 130 of FIG. 1. The sense amplifier section 200 includes sense amplifier sub-sections 205. A sense amplifier sub-section 205 includes sense amplifier groups 210(0)-210(N) and read/write (RW) circuits 220(0)-220(N). A sense amplifier group 210 is associated with a respective RW circuit 220. A sense amplifier group 210 includes a plurality of sense amplifiers (not shown in FIG. 2) that are configured to sense and amplify data states stored by memory cells. The memory cells may be coupled to a particular sense amplifier of the sense amplifier group 210 when activated for memory access operations. Sense amplifier activation circuits 214 coupled to the sense amplifier groups 210(0)-210(N) are configured to activate the sense amplifiers for memory access operations. A RW circuit 220 is shared by the sense amplifiers of the respective sense amplifier group 210, and in some embodiments, the RW circuit 220 may be embedded in the same region as the respective sense amplifier group 210 in the sense amplifier section 200.

In operation, the RW circuit 220 may be coupled to a selected sense amplifier for a memory access operation. For example, for a read operation a RW circuit 220 may be coupled to a selected sense amplifier to amplify a sensed data state of the selected sense amplifier. The RW circuit 220 may be coupled to a respective local data lines LIO, LIOF 225 to which the selected sense amplifier is coupled during the memory access operation. The RW circuit 220 is configured to provide the amplified data state to respective read data lines RIO, RIOF 230 for a read operation. The RIO, RIOF lines 230 may be coupled to a read driver circuit (not shown in FIG. 2) that senses the data state provided on the RIO, RIOF lines 230 and drives the output data from a memory. For a write operation a RW circuit 220 may be coupled to a selected sense amplifier of the respective sense amplifier group 210 to provide data from respective write data lines WIO, WIOF 240 to be written to memory cells that may be coupled to the selected sense amplifier. The WIO, WIOF lines 240 may be coupled to a write data circuit (not shown in FIG. 2) that drives write data received by a memory onto the WIO, WIOF lines to be written to and stored by the memory cells.

The RW circuits 220(0)-210(N) are coupled to a source RSLF 250. The RSLF source 250 may be coupled to a reference voltage (e.g., ground) through a source circuit 260 during a memory access operation, for example, a read operation. As previously discussed with reference to the memory block 100 FIG. 1, the RSLF source 250 of the sense amplifier section 200 may be coupled to the RSLF source 250 of another sense amplifier section. The source circuits 260 coupled to the RSLF source 250 of the sense amplifier section 200 and of the other sense amplifier section may both be used to provide a conductive path to a reference voltage. As a result, coupling the RSLF source 250 of a sense amplifier section 200 to the RSLF source 250 of another sense amplifier section 200 may provide greater capacity to discharge voltage through the source circuits during a memory access operation to memory cells of a memory section associated with the sense amplifier section 200. Memory cell access times may be improved by the increased discharge capacity of the multiple RSLF sources and source circuits.

Figure 3:
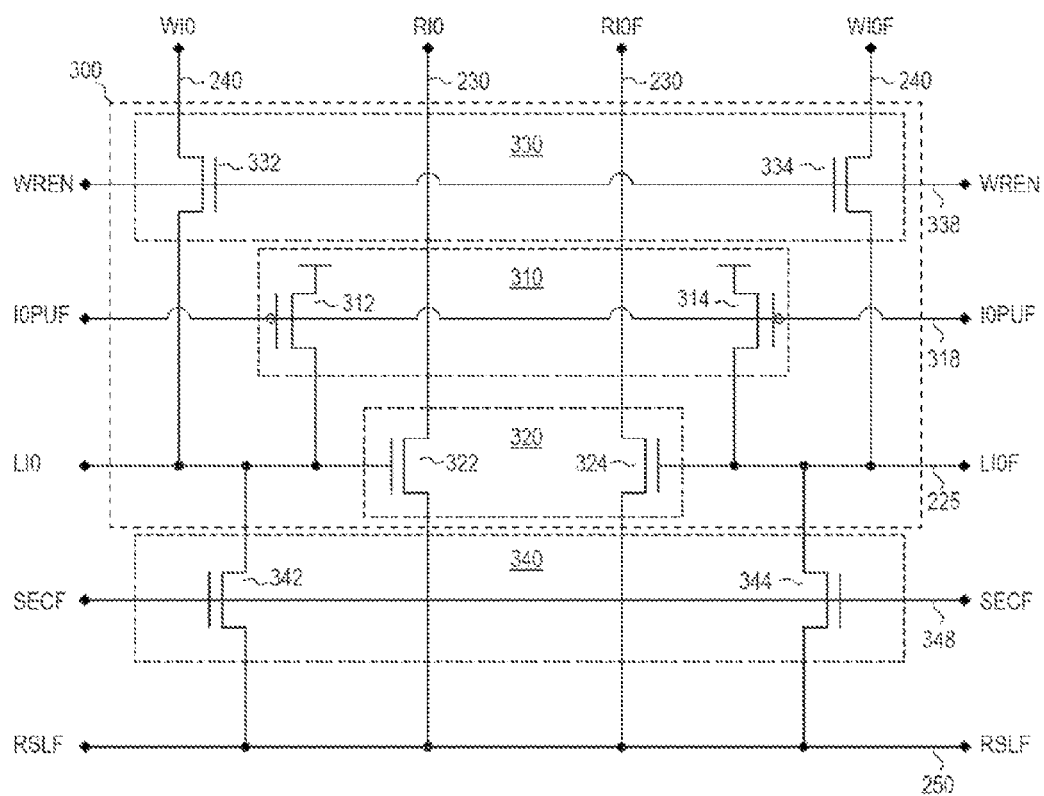
FIG. 3 is a schematic diagram of a read/write (RW) circuit according to an embodiment of the invention.

FIG. 3 illustrates a read/write (RW) circuit 300 according to an embodiment of the invention. The RW circuit 300 may be included in the RW circuit 220 of FIG. 2. The RW circuit 300 includes a precharge circuit 310 coupled to respective local data lines LIO and LIOF 225. The precharge circuit 310 is configured to precharge the LIO and LIOF lines 225 to a precharge voltage (e.g., supply voltage VCC) responsive to an active (e.g., active low) precharge signal provided by precharge activation line IOPUF 318. The precharge circuit 310 includes precharge switches 312 and 314 that couple the precharge voltage to the LIO and LIOF lines 225 responsive to the precharge signal. A read circuit 320 coupled to the LIO and LIOF lines 225 and to read data lines RIO and RIOF 230 is configured to couple one of the RIO and RIOF lines to a read voltage RSLF based on which of the LIO and LIOF lines has a high logic level. The read circuit 320 includes read switches 322 and 324 having gates coupled to a respective LIO and LIOF line 225, and a drain coupled to a respective RIO and RIOF line 230. Write data lines WIO and WIOF 240 may be coupled to the LIO and LIOF lines 225 through a write circuit 330. The write circuit 330 includes write switches 332 and 334 that are activated responsive to an active (e.g., active high) write enable signal provided by write enable line WREN 338.

The RSLF voltage may be provided to the RW circuit 300 over a source RSLF 250. Other RW circuits of the same sense amplifier section may be coupled to a common RSLF source 250 associated with that sense amplifier section, as previously described. For example, the RW circuits included in a sense amplifier section may each be provided the same RSLF voltage on the common RSLF source. Other groupings of RW circuits may receive the same RSLF voltage as well. Different groupings of RW circuits may receive different RSLF voltages. For example, the RW circuits in a sense amplifier section associated with an inactive memory section may be provided with a high voltage level RSLF voltage, whereas the RW circuits in a sense amplifier section associated with an active memory section may be provided with a RSLF voltage that may change voltage levels (e.g., from a high voltage level to a low voltage level, and/or from a low voltage level to a high voltage level) during a memory access operation to the active memory section. The RSLF source of a sense amplifier section may further be coupled to the RSLF source of another sense amplifier section so that the RSLF sources and source circuits of multiple sense amplifier sections may be shared. The sharing of a RSLF source and source circuit of another sense amplifier section may provide additional discharge capacity during a read operation for an active sense amplifier section, which may result in a decrease in read access time.

A RSLF section selection circuit 340 may be coupled to the RW circuit 300 and the RSLF source 250. The section selection circuit 340 includes selection switches 342 and 344 having gates coupled to a section selection signal line SECF that provides a section selection signal. The selection switches 342 and 344 are coupled to the RSLF source 250 and LIO and LIOF 225 lines of the RW circuit 300. The RSLF section selection circuit 340 may be configured to decouple the read data lines RIO, RIOF 230 from the RSLF source 250 responsive to an inactive (e.g., high) section selection signal. For example, assuming that the RSLF sources 250 of multiple sense amplifier sections are coupled together, the RSLF section selection circuit 340 may decouple the read data lines RIO, RIOF 230 of an inactive sense amplifier section from the RSLF source 250 associated with the inactive sense amplifier section to prevent corruption of data on the RIO and RIOF line 230 during a memory access operation when a RW circuit of another sense amplifier section (e.g., an active sense amplifier section) is coupled to the RSLF source of the inactive sense amplifier section.

In the embodiment illustrated in FIG. 3, the precharge switches 312 and 314 are PFETs, and the read switches 322 and 324 and the write switches 332 and 334 are NFETs. Other circuits may be used as well for these switches without departing from the scope of the present invention. The precharge signal, write enable signal, and section selection signal provided on IOPUF, WREN, and SECF lines, respectively, may be common signals provided to the RW circuits of a sense amplifier section.

In operation, the precharge circuit 310 is activated responsive to an active precharge signal, thereby coupling the LIO and LIOF lines 225 through precharge switches 312 and 314 to the precharge voltage (shown in FIG. 3 as a supply voltage VCC). The read switches 322 and 324 of the read circuit 320 are activated due to the gates being coupled to the precharge voltage. The selection switches 342 and 344 are inactive due to an active low section selection signal. During precharge, the RSLF voltage is relatively high voltage (e.g., at the VCC voltage) representing a high logic level. Following precharge, the LIO and LIOF lines 225 are at the precharge voltage in preparation for a read or write operation.

For a read operation, the precharge circuit 310 is deactivated responsive to an inactive precharge signal. The RSLF voltage, which was at a relatively high voltage representing a high logic level during precharge, changes to a relatively low voltage (e.g., ground) representing a low logic level for the read operation. A voltage difference is provided to the precharged LIO and LIOF lines 225, for example, responsive to activation of a column select circuit that couples an activated sense amplifier to the LIO and LIOF lines 225. For the present example, it is assumed that a high logic level is coupled to the LIO line and a low logic level is coupled to the LIOF line causing the read switch 324 to be deactivated while the read switch 322 remains activated. The activated read switch 322 couples the RIO line to the RSLF source to discharge the precharge voltage of the RIO line to a low logic level. As a result, a voltage difference is provided on the RIO and RIOF lines, in the present example, the RIO line is at a low voltage level representing a low logic level and the RIOF line is at a high voltage level representing a high logic level. A read amplifier (not shown in FIG. 3) coupled to the RIO and RIOF lines amplifies the voltage difference, which represents a data state, and provides data to be output from the memory.

For a write operation, the write circuit 330 is activated by an active write enable signal to couple a voltage difference on the WIO and WIOF lines 240 to the LIO and LIOF lines 225. The voltage difference on the WIO and WIOF lines 240, which may represent write data, may be provided by a write data driver (not shown in FIG. 3) coupled to the WIO and WIOF lines. The voltage difference is provided to the LIO and LIOF lines 225 to be written to a memory cell through the sense amplifier coupled to the LIO and LIOF lines. During the write operation, one of the switches 322 and 324 of the read circuit 320 may be coupled to a high logic level, however, the RSLF voltage is at the precharge voltage (e.g., a high logic level voltage) preventing the read circuit 320 from activating, and thus preventing current flow through the read circuit 320 during the write operation.

Following the read or write operation, the LIO and LIOF lines 225 may be precharged to the precharge voltage by the precharge circuit 310 in preparation for another memory access operation.

As previously discussed, the RSLF sources of multiple sense amplifier sections may be coupled together. The RSLF sources may be coupled to a respective source circuit, which may be activated during a memory access operation to couple the respective RSLF line to a reference voltage. While the selection switches 342 and 344 of a RSLF section selection circuit 340 for a RW circuit 300 in an active sense amplifier section may be inactive due to the active low SECF signal, the selection switches 342 and 344 of a RSLF section selection circuit 340 for a RW circuit 300 in an inactive sense amplifier section may be active responsive to an inactive high SECF signal. As a result, the LIO and LIOF lines 225 coupled to the RW circuit 300 of the inactive sense amplifier section are coupled to the RSLF line. During a read operation a low logic level of the RSLF source is coupled to the LIO and LIOF lines 225, and causes the read switches 322 and 324 to be inactive. The inactive read switches 322 and 324 prevent any voltage change on the RSLF source to affect the voltage of the RIO and RIOF lines through the RW circuits 300 of the inactive sense amplifier section. Thus, the RSLF source and source circuit of an inactive sense amplifier section may be used to provide additional discharge capacity to assist with the discharge of RIO and RIOF lines developed by the RW circuit of the active sense amplifier section. With a faster discharge, a memory access operation may be completed faster.

Figure 4:
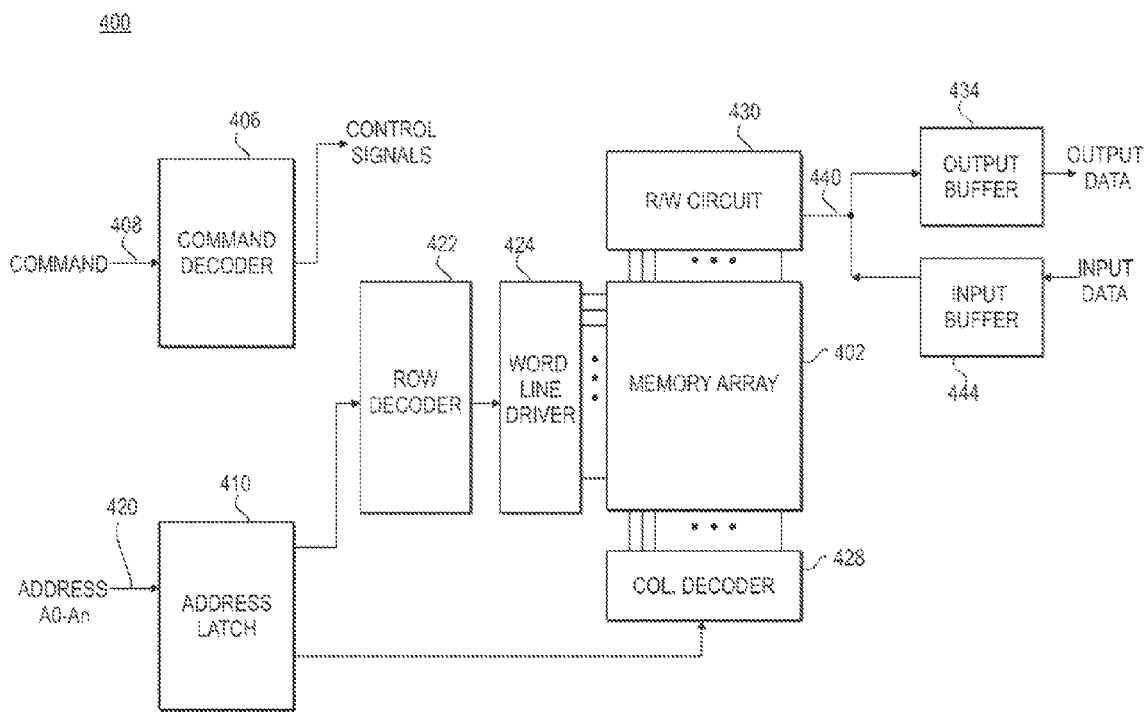
FIG. 4 is a block diagram of a memory including a memory block according to an embodiment of the invention.

FIG. 4 illustrates a portion of a memory 400 according to an embodiment of the present invention. The memory 400 includes an array 402 of memory cells, which may be, for example, volatile memory cells (e.g., DRAM memory cells, SRAM memory cells, etc.), non-volatile memory cells (e.g., flash memory cells, PCM cells, etc.), or some other types of memory cells. The array 402 includes a memory block according to an embodiment of the invention. For example, the array 402 may include a memory block having sense amplifier sections and associated sources RSLF. The RSLF sources of a sense amplifier section may be coupled to the RSLF sources of one or more other sense amplifier sections.

The memory 400 includes a command decoder 406 that receives memory commands through a command bus 408 and generates corresponding control signals within the memory 400 to carry out various memory operations. The command decoder 406 responds to memory commands applied to the command bus 408 to perform various operations on the memory array 402. For example, the command decoder 406 is used to generate internal control signals to read data from and write data to the memory array 402. Row and column address signals are applied to the memory 400 through an address bus 420 and provided to an address latch 410. The address latch then outputs a separate column address and a separate row address.

The row and column addresses are provided by the address latch 410 to a row address decoder 422 and a column address decoder 428, respectively. The column address decoder 428 selects bit lines extending through the array 402 corresponding to respective column addresses. The row address decoder 422 is connected to word line driver 424 that activates respective rows of memory cells in the array 402 corresponding to received row addresses. The selected data line (e.g., a bit line or bit lines) corresponding to a received column address are coupled to a read/write circuitry 430 to provide read data to a data output buffer 434 via an input-output data bus 440. Write data are applied to the memory array 402 through a data input buffer 444 and the memory array read/write circuitry 430.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
   a memory section; and
   a first sense amplifier section associated with the memory section and including a sense amplifier and a read/write circuit, the read/write circuit coupled to a source associated with the first sense amplifier section and the source associated with the first sense amplifier section coupled to a source associated with a second sense amplifier section, wherein the second sense amplifier section is configured to be inactive during a memory access operation to the memory section and wherein voltage is discharged through the read/write circuit to the sources associated with the first and second sense amplifier sections during the memory access operation.

2. The apparatus of claim 1 wherein the memory section comprises a plurality of memory sub-sections and the first sense amplifier section includes a plurality of sense amplifier sub-sections, a memory sub-section of the plurality of memory sub-sections including memory cells that are coupled to access lines and a sense amplifier sub-section of the plurality of sense amplifier sub-sections including a plurality of sense amplifiers coupled to the memory cells of the memory sub-section of the plurality of memory sub-sections.

3. The apparatus of claim 1 wherein the first sense amplifier section includes a sense amplifier sub-section, and the sense amplifier sub-section includes a plurality of sense amplifiers coupled to the read/write circuit.

4. The apparatus of claim 1 wherein the first sense amplifier section includes a plurality of sense amplifier sub-sections, and each sense amplifier sub-section of the plurality of sense amplifier sub-sections includes a respective read/write circuit, wherein the read/write circuits of the plurality of sense amplifier sub-sections are coupled to the source associated with the first sense amplifier section.

5. The apparatus of claim 1 wherein the memory section is a first memory section and the apparatus further comprises a second memory section, wherein the second sense amplifier section is associated with the second memory section.

6. The apparatus of claim 1, further comprising a third sense amplifier section wherein the third sense amplifier section includes a sense amplifier sub-section, the sense amplifier sub-section of the third sense amplifier section including sense amplifiers coupled to memory cells of a memory sub-section of the memory section.

7. The apparatus of claim 1, wherein the source associated with the first sense amplifier section being coupled to the source associated with the second sense amplifier section comprises the source associated with the first sense amplifier section being directly coupled to the source associated with the second sense amplifier section.

8. An apparatus, comprising:
a memory section; and
a first sense amplifier section associated with the memory section and including a sense amplifier and a read/write circuit, the read/write circuit coupled to a source associated with the first sense amplifier section and the source associated with the first sense amplifier section coupled to a source associated with a second sense amplifier section, wherein the second sense amplifier section is configured to be inactive during a memory access operation to the memory section, wherein the read/write circuit comprises:
a precharge circuit configured to precharge local data lines;
a read circuit coupled to the local data lines and to read data lines, the read circuit configured to selectively couple the read data lines to the source based at least in part on logic levels of the local data lines; and
a write circuit coupled to the local data lines and to write data lines, the write circuit configured to selectively couple the write data lines to the local data lines based at least in part on a logic level of a write enable signal.

9. The apparatus of claim 8, further comprising:
a selection circuit coupled to the source associated with the first sense amplifier section and the read/write circuit, the selection circuit configured to selectively decouple the read data lines from the source.

10. An apparatus, comprising:
a first memory sub-section including a first plurality of memory cells and including a second plurality of memory cells;
a second memory sub-section including a third plurality of memory cells and including a fourth plurality of memory cells;
a first sense amplifier group including a first plurality of sense amplifiers coupled to the first plurality of memory cells of the first memory sub-section, the first plurality of sense amplifiers coupled to a first read/write circuit that is coupled to a first source;
a second sense amplifier group including a second plurality of sense amplifiers coupled to the third plurality of memory cells of the second memory sub-section, the second plurality of sense amplifier coupled to a second read/write circuit that is coupled to a second source, wherein the second source is coupled to the first source; and
a third sense amplifier group including a third plurality of sense amplifiers coupled to the second plurality of memory cells of the first memory sub-section and further including a fourth plurality of sense amplifiers coupled to the fourth plurality of memory cells of the second memory sub-section, the third plurality of sense amplifiers coupled to a third read/write circuit that is coupled to a third source.

11. The apparatus of claim 10, further comprising:
a third memory sub-section including a fifth plurality of memory cells and including a sixth plurality of memory cells, wherein the second sense amplifier group further includes a sixth plurality of sense amplifiers coupled to the fifth plurality of memory cells of the third memory sub-section; and
a fourth sense amplifier group including a fifth plurality of sense amplifiers coupled to the sixth plurality of memory cells of the third memory sub-section, the fifth plurality of sense amplifiers coupled to a fourth read/write circuit that is coupled to a fourth source, wherein the fourth source is coupled to the third source.

12. The apparatus of claim 10 wherein the first plurality of memory cells comprises a plurality of volatile memory cells.

13. The apparatus of claim 10 wherein the first sense amplifier sub-section is included in a first sense amplifier section, the second sense amplifier group is included in a second sense amplifier section, and the third sense amplifier group is included in a third sense amplifier section.

14. The apparatus of claim 13, further comprising:
a sense amplifier activation circuit coupled to the first sense amplifier group and to other sense amplifier groups of the first sense amplifier section, the sense amplifier activation circuit configured to activate sense amplifiers of the first sense amplifier group and sense amplifiers of the other sense amplifier groups of the first sense amplifier section.

15. The apparatus of claim 13, further comprising:
a source circuit coupled to the first source and configured to couple the first source to a reference voltage during a memory access operation.

16. The apparatus of claim 10, further comprising:
a fourth sense amplifier group including a fourth plurality of sense amplifiers coupled to memory cells of the first memory sub-section, the fourth plurality of sense amplifiers coupled to a fourth read/write circuit that is coupled to the first source.

17. The apparatus of claim 10, further comprising:
access line drivers coupled to access lines of the first memory sub-section and configured to drive the access lines to activate memory cells of the first memory sub-section during a memory access operation.

18. A method, comprising:
accessing memory cells of a first memory section during a memory access operation;
activating a first sense amplifier section to couple sense amplifiers of the first sense amplifier section to the memory cells of the first memory section;

coupling the sense amplifiers of the first sense amplifier section to read/write circuits of the first sense amplifier section;

coupling the read/write circuits of the first sense amplifier section to a first source that is coupled to a second source of a second sense amplifier section, wherein the second sense amplifier section is inactive during the memory access operation of memory cells of the first memory section; and discharging voltage through the read/write circuits of the first sense amplifier section to the first and second sources during the memory access operation of memory cells of the first memory section.

19. A method, comprising:

accessing memory cells of a first memory section during a memory access operation;

activating a first sense amplifier section to couple sense amplifiers of the first sense amplifier section to the memory cells of the first memory section;

coupling the sense amplifiers of the first sense amplifier section to read/write circuits of the first sense amplifier section;

coupling the read/write circuits of the first sense amplifier section to a first source that is coupled to a second source of a second sense amplifier section, wherein the second sense amplifier section is inactive during the memory access operation of memory cells of the first memory section;

activating a third sense amplifier section to couple sense amplifiers of the third sense amplifier section to other memory cells of the first memory section;

coupling the sense amplifiers of the third sense amplifier section to read/write circuits of the third sense amplifier section; and coupling the read/write circuits of the third sense amplifier section to a third source that is coupled to a fourth source of a fourth sense amplifier section, wherein the fourth sense amplifier section is inactive during the memory access operation of memory cells of the first memory section.

20. The method of claim 18, further comprising coupling the first source to a reference voltage.

* * * * *